(12) United States Patent
Jin et al.

(10) Patent No.: US 12,396,306 B2
(45) Date of Patent: Aug. 19, 2025

(54) DISPLAY DEVICE AND METHOD OF MANFUACTURING THE SAME

(71) Applicant: SILICON DISPLAY TECHNOLOGY, Yongin-si (KR)

(72) Inventors: Jong Woo Jin, Seoul (KR); Jin Hyeong Yu, Yongin-si (KR)

(73) Assignee: SILICON DISPLAY TECHNOLOGY, Yongin-si (KR)

( * ) Notice: Subject to any disclaimer, the term of this patent is extended or adjusted under 35 U.S.C. 154(b) by 558 days.

(21) Appl. No.: 17/669,529

(22) Filed: Feb. 11, 2022

(65) Prior Publication Data
US 2023/0170451 A1 Jun. 1, 2023

(30) Foreign Application Priority Data
Nov. 29, 2021 (KR) .................. 10-2021-0167506

(51) Int. Cl.
| | |
|---|---|
| *H10H 20/857* | (2025.01) |
| *H10H 20/01* | (2025.01) |
| *H10H 20/824* | (2025.01) |
| *H10H 20/831* | (2025.01) |
| *H10H 20/833* | (2025.01) |
| *H10H 29/14* | (2025.01) |

(52) U.S. Cl.
CPC .......... *H10H 20/857* (2025.01); *H10H 20/01* (2025.01); *H10H 20/824* (2025.01); *H10H 20/8312* (2025.01); *H10H 20/833* (2025.01); *H10H 29/142* (2025.01); *H10H 20/032* (2025.01); *H10H 20/0364* (2025.01)

(58) Field of Classification Search
CPC ... H01L 33/62; H01L 27/124; H01L 33/0062; H01L 27/156; H01L 33/30; H01L 33/382; H01L 33/42; H01L 25/0753; H01L 33/60
See application file for complete search history.

(56) References Cited

U.S. PATENT DOCUMENTS

| | | | |
|---|---|---|---|
| 6,910,779 B2* | 6/2005 | Abel ..................... | B60R 1/08 |
| | | | 359/839 |
| 10,714,008 B1* | 7/2020 | Lu ......................... | G09G 3/3233 |
| 11,955,038 B1* | 4/2024 | Zhang ................... | G02B 30/29 |
| 2009/0059341 A1* | 3/2009 | Kinugawa ............ | G09G 3/3648 |
| | | | 313/500 |
| 2018/0050641 A1* | 2/2018 | Lin ....................... | G02F 1/155 |
| 2020/0234647 A1* | 7/2020 | Lin ....................... | G09G 3/3266 |
| 2021/0319756 A1* | 10/2021 | Kim ..................... | G09G 3/3233 |
| 2022/0013578 A1* | 1/2022 | Ikeda ................... | G06F 3/0445 |

(Continued)

*Primary Examiner* — Chad M Dicke
*Assistant Examiner* — Jeremy Daniel Watts
(74) *Attorney, Agent, or Firm* — LEX IP MEISTER, PLLC

(57) ABSTRACT

Disclosed is a display device including: a substrate including a plurality of first pads transmitting a gate signal, a plurality of second pads transmitting a data signal, a plurality of third pads transmitting a first power voltage, and a plurality of fourth pads transmitting a second power voltage different from the first power voltage within a display area; and a plurality of display modules, each of which includes a light emitting diode connected to first to fourth electrodes attached to the first to fourth pads, a first transistor connected to the first electrode and the second electrode, a second transistor connected to the third electrode, and a light emitting diode connected to the second transistor and the fourth electrode.

15 Claims, 11 Drawing Sheets

(56) References Cited

U.S. PATENT DOCUMENTS

| | | | |
|---|---|---|---|
| 2022/0085327 A1* | 3/2022 | Kim | H10K 50/844 |
| 2023/0033341 A1* | 2/2023 | Shin | H10H 20/8312 |
| 2023/0090344 A1* | 3/2023 | Chalasani | H10H 29/142 |
| | | | 345/440.1 |
| 2023/0290916 A1* | 9/2023 | Um | H01L 25/16 |

* cited by examiner

DISPLAY DEVICE AND METHOD OF MANFUACTURING THE SAME

CROSS-REFERENCE TO RELATED APPLICATION

This application claims priority to and the benefit of Korean Patent Application No. 10-2021-0167506 filed in the Korean Intellectual Property Office on Nov. 29, 2021, the entire contents of which are incorporated herein by reference.

BACKGROUND

(a) Field

An exemplary embodiment relates to a display device and a method of manufacturing the display device.

(b) Description of the Related Art

Recently, a Light Emitting Diode (LED) display device using an LED as a light emitting element has been developed. In the LED display device, a small LED (mini LED and micro LED) may be used. The LED display device has a large advantage in terms of power consumption reduction and miniaturization.

In the meantime, a transparent display device using the LED display device may be applied in various fields because an object or an image located at the rear of the display device can pass the display device and be recognized by a user located in front of the display device.

The above information disclosed in this Background section is only for enhancement of understanding of the background, and therefore it may contain information that does not form the prior art that is already known in this country to a person of ordinary skill in the art.

SUMMARY

The present invention has been made in an effort to provide a display device with higher transmittance.

The present invention has also been made in an effort to provide a display device in which a display module is easily bonded with a substrate.

An exemplary embodiment of the present invention provides a display device including: a substrate including a plurality of first pads transmitting a gate signal, a plurality of second pads transmitting a data signal, a plurality of third pads transmitting a first power voltage, and a plurality of fourth pads transmitting a second power voltage different from the first power voltage within a display area; and a plurality of display modules, each of which includes first to fourth bonding electrodes attached to the first to fourth pads, a first transistor connected to the first bonding electrode and the second bonding electrode, a second transistor connected to the third bonding electrode, and a light emitting diode connected to the second transistor and the fourth bonding electrode.

The substrate further includes a plurality of gate lines and a plurality of second power voltage lines extended in a first direction and arranged in a second direction crossing the first direction, and a plurality of data lines and a plurality of first power voltage lines extended in the second direction and arranged in the first direction, and the plurality of first pads is connected to the plurality of gate lines, the plurality of second pads is connected to the plurality of data lines, the plurality of third pads is connected to the plurality of first power voltage lines, and the plurality of fourth pads is connected to the plurality of second power voltage lines.

The plurality of display modules is arranged in a matrix form in the first direction and the second direction, and at least one of the plurality of display modules is arranged to be shifted in a column direction or a row direction.

At least one of the plurality of display modules connected to the first data line among the plurality of data lines is connected to a first power voltage line different from first power voltage lines of other display modules.

At least one of the plurality of display modules connected to a first gate line among the plurality of gate lines is connected to a second power voltage line different from second power voltage lines of other display modules.

The plurality of display modules includes a plurality of first display modules each of which includes a plurality of light emitting diodes, and a plurality of second display modules each of which includes one light emitting diode.

In the plurality of first display modules, the plurality of light emitting diodes is arranged in different forms.

The plurality of gate lines and the plurality of second power voltage lines, and the plurality of data lines and the plurality of first power voltage lines are located on different layers.

The display area has a non-quadrangular form.

The substrate has a curved form.

The substrate includes at least one of a front glass, a rear glass, and side mirrors of a vehicle.

The display device further includes a curved glass substrate, and the substrate is flexible and is attached to the glass substrate.

The glass substrate may include at least one of a front glass, a rear glass, and side mirrors of a vehicle.

The display device may further include a gate driving unit supplying the gate signal and a source driving unit supplying the data signal, the gate driving unit and the source driving unit being disposed in a bezel area.

Each of the plurality of display modules further includes: a display element including a substrate, a first conductive semiconductor layer on the substrate, a first electrode on the first conductive semiconductor layer, a first activation layer on the first conductive semiconductor layer, a second conductive semiconductor layer on the first activation layer, a reflective layer on the second conductive semiconductor layer, a first passivation layer covering the reflective layer, a first electrode connected to the first conductive semiconductor layer and located on the first passivation layer, and a second electrode connected to the reflective layer and located on the passivation layer, in which the light emitting diode includes the first conductive semiconductor layer, the first activation layer, and the second conductive semiconductor layer; and a transistor including a first gate electrode on the first passivation layer, a gate insulating layer on the first gate electrode, a second activation layer on the gate insulating layer, a source electrode and a drain electrode on the second activation layer, a second passivation layer covering the source electrode and the drain electrode, and a second gate electrode on the second passivation layer, and the first bonding electrode is connected to the first electrode, the second bonding electrode is connected to the drain electrode, and the second electrode is connected to the source electrode.

Another exemplary embodiment of the present invention provides a display device including: a display element including a substrate, a first conductive semiconductor layer on the substrate, a first electrode on the first conductive semiconductor layer, a first activation layer on the first conductive semiconductor layer, a second conductive semiconductor layer on the first activation layer, a reflective layer on the second conductive semiconductor layer, a first passivation layer covering the reflective layer, a first electrode connected to the first conductive semiconductor layer and located on the first passivation layer, and a second electrode connected to the reflective layer and located on the passivation layer, a transistor including a first gate electrode on the first passivation layer, a gate insulating layer on the first gate electrode, a second activation layer on the gate insulating layer, a source electrode and a drain electrode on the second activation layer, a second passivation layer covering the source electrode and the drain electrode, and a second gate electrode on the second passivation layer; and a first bonding electrode connected to the first electrode and a second bonding electrode connected to the drain electrode, in which the second electrode is connected to the source electrode.

The first conductive semiconductor layer and the second conductive semiconductor layer may be formed of an III-V group material.

The first activation layer may be formed of an III-V group material.

At least one of the first electrode, the second electrode, the first gate electrode, the source electrode, the drain electrode, the second gate electrode, the first bonding electrode, and the second bonding electrode may include at least one transparent material of an indium tin oxide (ITO), an indium zinc oxide (IZO), and an Ag nanowire.

Another exemplary embodiment of the present invention provides a method of manufacturing a display device, the method including: forming a first conductive semiconductor layer on a substrate; forming a first activation layer on the first conductive semiconductor layer; forming a second conductive semiconductor layer on the first activation layer; forming a light emitting diode by forming a reflective layer on the second conductive semiconductor layer; forming a first passivation layer covering the reflective layer; forming a first electrode connected to the first conductive semiconductor layer on the first passivation layer and a second electrode and a first gate electrode connected to the reflective layer; forming a gate insulating layer on the first gate electrode; forming a second activation layer on the gate insulating layer; forming a drain electrode and a source electrode connected to the second electrode on the second activation layer; forming a second passivation layer covering the source electrode and the drain electrode; forming a transistor by forming a second gate electrode on the second passivation layer; forming a third passivation layer on the second gate electrode; forming a first bonding electrode connected to the first electrode and a second bonding electrode connected to the drain electrode on the third passivation layer; cutting the substrate on which the light emitting diode and the transistor are formed into a plurality of display modules; and attaching the display module to the substrate including a plurality of pads to which a signal used for the light emitting diode to emit light is applied.

According to the exemplary embodiments, the effects of the display device and the method of manufacturing the display device are as follows.

According to at least one of the exemplary embodiments, there is an advantage in that it is possible to provide a more transparent display device.

Further, according to at least one of the exemplary embodiments, there is an advantage in that it is possible to decrease a possibility of damage of a bonding portion between a substrate and a display module of a display device.

DETAILED DESCRIPTION OF THE EMBODIMENTS

Figure 1:
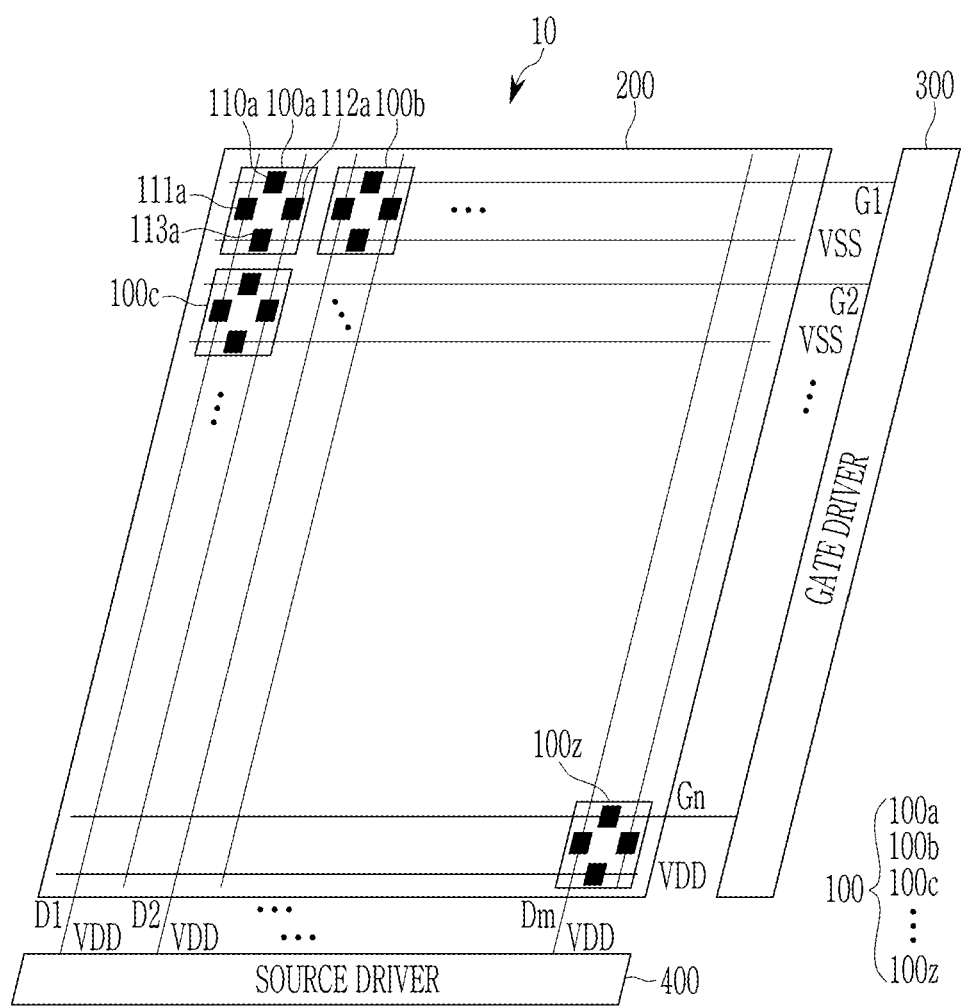
FIG. 1 is a block diagram schematically illustrating a display device according to an exemplary embodiment.

Hereinafter, exemplary embodiments of the present invention will be described with reference to accompanying drawings so as to be easily understood by a person ordinary skilled in the art. However, the present invention can be variously implemented and is not limited to the following exemplary embodiments.

In addition, the size and thickness of each configuration shown in the drawings are arbitrarily shown for understanding and ease of description, but the present invention is not limited thereto.

Further in the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described to the contrary, the word "comprise", and variations such as "comprises" or "comprising", will be understood to imply the inclusion of stated elements but not the exclusion of any other elements. Further, in the specification, the word "on" means positioning on or below the object portion, but does not essentially mean positioning on the upper side of the object portion based on a gravity direction.

Hereinafter, a display device according to an exemplary embodiment will be described with reference to FIG. 1.

FIG. 1 is a block diagram schematically illustrating a display device according to an exemplary embodiment. As illustrated in FIG. 1, the display device 10 includes a plurality of display modules 100*a*, 100*b*, 100*c*, . . . , and 100*z*, a substrate 200 on which the plurality of display modules 100*a*, 100*b*, 100*c*, . . . , and 100*z* are located, and driving units 300 and 400 providing signals corresponding to the plurality of display modules 100*a*, 100*b*, 100*c*, . . . , and 100*z*.

Each display module 100 includes a display element emitting light according to the signals of the driving units 300 and 400. One display module 100 may have one display element or a plurality of display elements emitting light of one color wavelength.

The signals from the driving units 300 and 400 may be transmitted to each display module 100 through a plurality of bonding electrodes 110a, 111a, 112a, and 113a of each display module 100. The plurality of bonding electrodes 110a, 111a, 112a, and 113a is electrically connected with a bonding pad on the substrate 200.

The number of plurality of bonding electrodes 110a, 111a, 112a, and 113a is different depending on the number of display elements included in each display module 100. For example, four types of signals (for example, a gate signal, a data signal, a first power voltage, and a second power voltage) are applied to one display element, the display module 100 including one display element may have fourth bonding electrodes, and the display module 100 including four display elements may have 16 bonding electrodes. The plurality of bonding electrodes 110a, 111a, 112a, and 113a may be formed of a transparent material.

The display module 100 including the plurality of display elements may also include a common bonding electrode receiving a signal commonly applied to each display element. For example, the display module 100 including four display elements in the form of 1×4 may include seven bonding electrodes (four data signal bonding electrodes, one gate signal bonding electrode, one first power voltage bonding electrode, and one second power voltage bonding electrode).

The substrate 200 includes a plurality of signal lines. For example, the substrate 200 includes a plurality of gate lines G1, G2, . . . , and Gn, and a plurality of data lines D1, D2, . . . , and Dm. Further, the substrate 200 includes power voltage lines VDD and VSS providing the power voltage. The plurality of signals lines may be located on different layers or located on the same layer on the substrate 200.

The plurality of data lines D1, D2, . . . , and Dm is extended in a substantially column direction and is almost parallel to each other. The plurality of gate lines G1, G2, . . . , and Gn is extended in a substantially row direction and is almost parallel to each other.

A bonding pad on the substrate 200 may be located on a surface of the substrate 200. The disposition forms of the bonding pads connected to one display element on the substrate 200 are the same. The bonding pad on the substrate 200 is electrically connected with the plurality of signal lines.

A gate driving unit 300 is connected with each display module 100 through the plurality of gate lines G1, G2, . . . , and Gn. The gate driving unit 300 generates the plurality of gate signals according to the control signal and transmits the generated gate signal to the corresponding gate line among the plurality of gate lines.

A source driving unit 400 is connected with each display module 100 through the plurality of data lines D1, D2, . . . , and Dm. The source driving unit 400 receives an image data signal, a control signal, and the like and transmits a data signal to the corresponding data line among the plurality of data lines D1, D2, . . . , and Dm. The source driving unit 400 selects a grayscale voltage according to the image data signal and transmits the selected grayscale signal to the plurality of data lines as the data signal.

The source driving unit 400 samples and holds the image data signal, and transmits the plurality of data signals to the plurality of data lines D1, D2, . . . , and Dm, respectively. For example, the source driving unit 400 may apply a data signal having a predetermined voltage range to the plurality of data lines D1, D2, . . . , and Dm in response to the gate signal of an enable level.

In addition to this, the gate driving unit 300 and/or the source driving unit 400 apply the first power voltage and the second power voltage to the power voltage lines VDD and VSS. The first power voltage applied to a power voltage line VDD and the second power voltage applied to the power voltage line VSS may have different values.

The substrate 200, the signal lines G1, G2, . . . , Gn, D1, D2, . . . , Dm, VDD, and VSS, and the pads 110a, 111a, 112a, and 113a on the substrate are formed of the transparent material and the transparent electrode is also used in the display module 100, thereby implementing the display device 100 with high transmittance.

In the meantime, when the substrate 200 has stretchable, flexible, bendable, and foldable properties, a curved display with high transmittance may be implemented by mounting the display module 100 to the substrate 200. Otherwise, a curved display with high transmittance may also be implemented by mounting the display module 100 to the substrate 200 and then attaching the substrate 200 to a curved glass substrate and the like in a specific form. The curved display may be used as a front glass, a rear glass, and a side mirror of a vehicle, glass of a building, and a mirror.

Next, the display element included in the display module 100 will be described with reference to FIG. 2.

Figure 2:
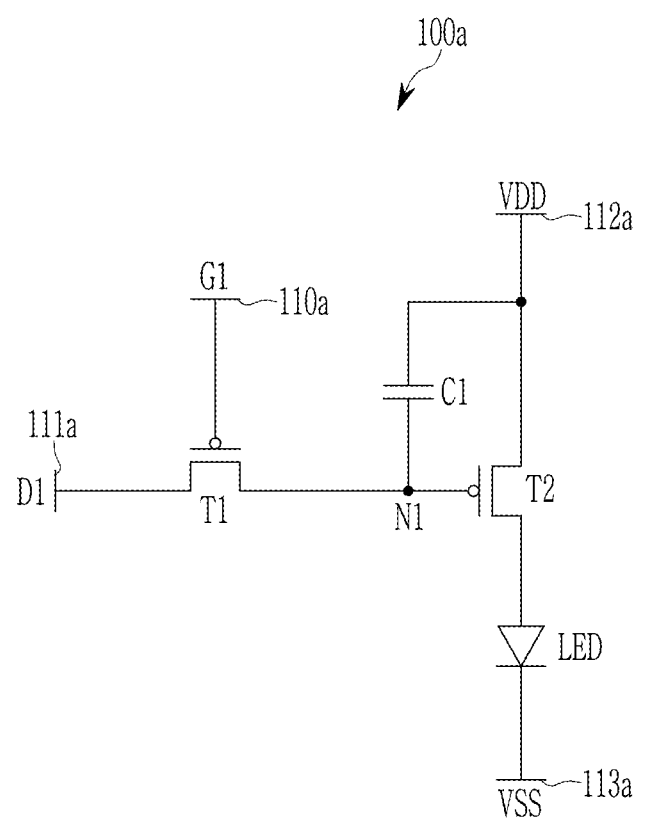
FIG. 2 is a circuit diagram illustrating an example of a display element of the display device according to an exemplary embodiment.

FIG. 2 is a circuit diagram illustrating an example of a display device of the display element according to an exemplary embodiment. The display element will be described based on a display module 100a as an example.

Referring to FIG. 2, the display element includes a first transistor T1, a second transistor T2, a storage capacitor C1, and a light emitting diode LED.

A gate of the first transistor T1 is connected with the first gate line G1 through the bonding electrode 110a, one end of the first transistor T1 is connected with the data line D1 through the bonding electrode 111a, and the other end of the first transistor T1 is connected to a gate of the first transistor T1 at a first node N1.

The first transistor T1 is turned on according to the gate signal received through the gate line G1 and performs a switching operation of transmitting the data signal transmitted to the data line D1 to the first node N1.

A gate of the second transistor T2 is connected to one electrode of a storage capacitor C1 at the first node N1, one end of the second transistor T2 is connected with the power voltage line VDD supplying the first power voltage through the bonding electrode 112a, and the other end of the second transistor T2 is electrically connected with an anode of the light emitting diode LED. The second transistor T2 receives a data signal according to a switching operation of the first transistor T1 and supplies a driving current to the light emitting diode LED.

The other electrode of the storage capacitor C1 is connected with the power voltage line VDD through a bonding electrode 113a.

A cathode of the light emitting diode LED is connected with the power voltage line VSS. The light emitting diode LED receives a driving current from the second transistor T2 and emits light.

Next, the substrate 200 on which the display module 100 is disposed will be described with reference to FIG. 3.

Figure 3:
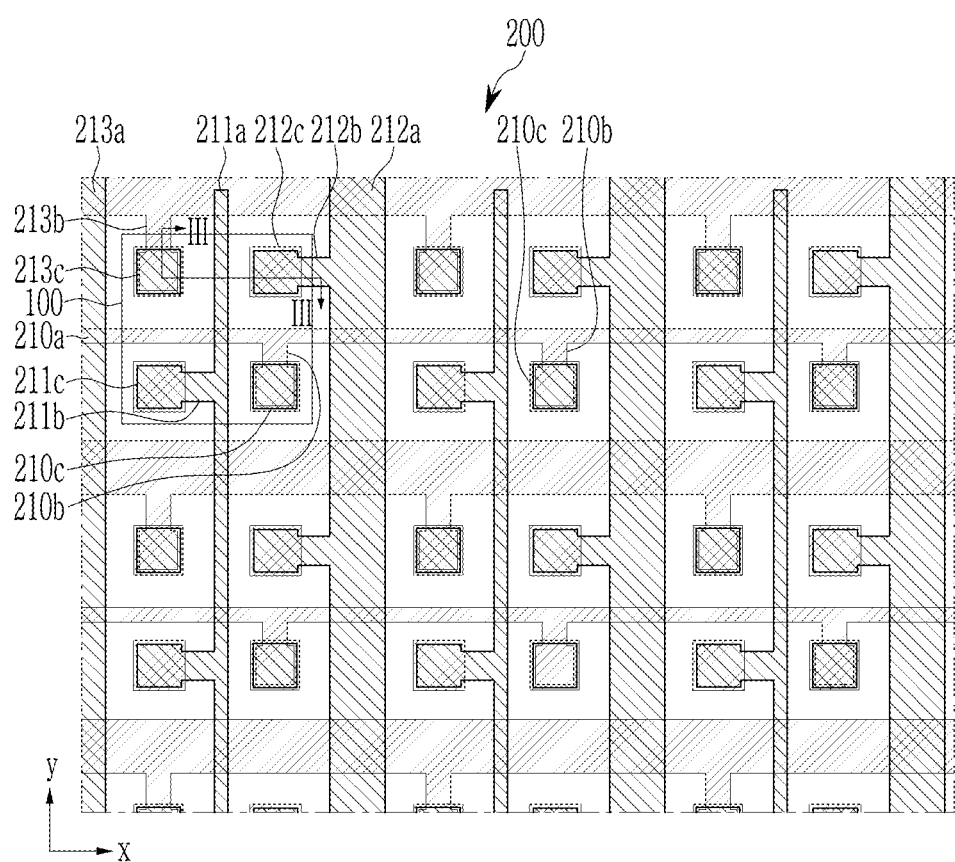
FIG. 3 is a top plan view illustrating a substrate of the display device according to the exemplary embodiment.

FIG. 3 is a top plan view illustrating the substrate of the display device according to the exemplary embodiment.

On the substrate 200, a gate line 210 and a power voltage line 213 extended in a first direction (x-axis direction) are arranged in a second direction (y-axis direction), and a data line 211 and a power voltage line 212 extended in the second direction (y-axis direction) are arranged in the first direction (x-axis direction).

The gate line 210 and the power voltage line 213 may be located on the different layer from that of the data line 211 and the power voltage line 212.

The form of the disposition of the pads 210c, 211c, 212c, and 213c corresponding to one display element may be the same on the substrate 200. Each of the pads 210c, 211c, 212c, and 213c is connected to a signal line corresponding to the plurality of signal lines 210a, 211a, 212a, and 213a through corresponding one among connection wires 210b, 211b, 212b, and 213b.

Next, a structure of the display device will be described with reference to FIG. 4.

Figure 4:
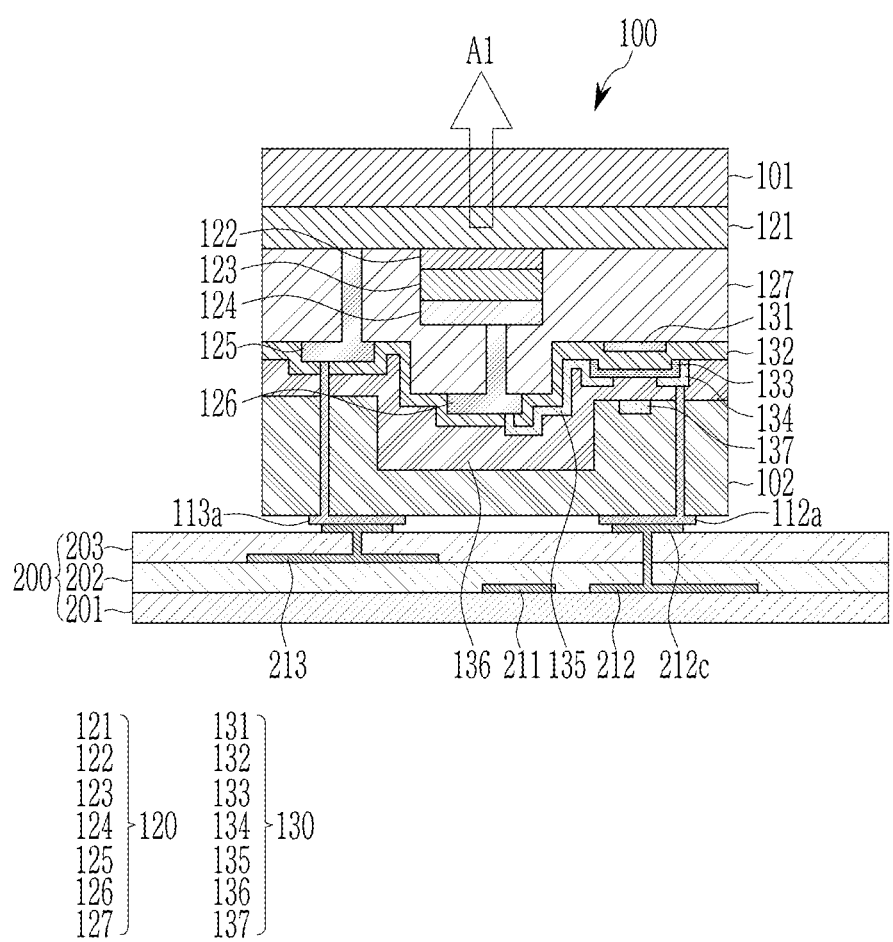
FIG. 4 is a cross-sectional view of a partial region of the display device in which a display module is bonded to the substrate of FIG. 3.

FIG. 4 is a cross-sectional view of a partial region of the display device in which the display module is bonded to the substrate of FIG. 3.

Referring to FIG. 4, the display module 100 is located on the substrate 200. The bonding electrodes 112a and 113a of the display module 100 are electrically connected to the pads 212c and 213c of the substrate 200.

The display element 120 may be located on a module substrate 101. In this case, the module substrate 101 may be selected from the group consisting of sapphire, silicon carbide, zinc oxide, gallium nitride, aluminum nitride, zirconium diboride, gallium arsenide, and silicon, but is not limited thereto.

In particular, other than sapphire, other heterogeneous substrates, such as glass, silicon carbide, silicon, GaAs, GaP, AlGaINP, Ge, SiSe, GaN, AlInGaN, and InGaN, may be used.

A transistor 130 is located on the module substrate 101. The display element 120 is connected with the transistor 130 (the second transistor T2 of FIG. 2). For example, an electrode 126 of the display element 120 is connected with an electrode 135 of the transistor 130.

The transistor 130 according to the exemplary embodiment of the present invention may be configured with any one of a coplanar structure, a staggered structure, an inverted coplanar structure, and an inverted staggered structure.

The display element 120 includes a first conductive semiconductor layer 121, a first electrode 125, a first activation layer 122, a second conductive semiconductor layer 123, a second electrode 126, and a first passivation layer 127.

More particularly, the first conductive semiconductor layer 121 is located on the module substrate 101. The first activation layer 122 is located on the first conductive semiconductor layer 121, and the second conductive semiconductor layer 123 is located on the first activation layer 122.

In this case, the first activation layer 122 may have a quantum well structure, such as GaN, InGaN, AlGaN, GaP, AlGaInP, AlInP, InP, GaAs, InGaAs, and AlGaAs, and may be formed of a III-V group material.

The first conductive semiconductor layer 121 and the second conductive semiconductor layer 123 may include a p-GaN-based semiconductor material or an n-GaN-based semiconductor material, but the materials of the first activation layer 122 and the semiconductor layers 121 and 123 are not limited thereto. The n-GaN-based semiconductor material may include a III-V group material, such as GaN, n-GaN, n-InGaN, n-AlGaN, n-GaP, n-AlGaInP, n-AlInP, n-InP, n-GaAs, n-InGaAs, and n-AlGaAs. When the first conductive semiconductor layer 121 includes an n-GaN-based semiconductor material, impurities used for doping the first conductive semiconductor layer 121 include Si, Ge, Se, Te, or C. The p-GaN-based semiconductor material may include an III-V group material, such as GaN, p-GaN, p-InGaN, p-AlGaN, p-GaP, p-AlGaInP, p-AlInP, p-InP, p-GaAs, p-InGaAs, and p-AlGaAs. Herein when the second conductive semiconductor layer 123 includes the p-GaN-based semiconductor material, impurities used for doping the second conductive semiconductor layer 123 includes Mg, Zn, or Be.

A reflective layer 124 is located on the second conductive semiconductor layer 123. Therefore, the display module 100 emits light in direction A1.

A first passivation layer 127 is located on the reflective layer 124. The first electrode 125 is connected to the first conductive semiconductor layer 121 through a contact hole, and the second electrode 126 is connected to the reflective layer 124 through a contact hole. The first electrode 125 and the second electrode 126 may include a transparent material including at least one of an indium tin oxide (ITO), an indium zinc oxide (IZO), and an Ag nanowire.

In the meantime, the transistor 130 is formed of a first gate electrode 131, a gate insulating layer 132, a second activation layer 133, a source electrode 134, a drain electrode 135, a second passivation layer 136, and a second gate electrode 137. The transistor 130 is a dual gate transistor, and may decrease a leakage current flowing through the transistor 130.

In particular, the first gate electrode 131 is located on the first passivation layer 127. The gate insulating layer 132 is located on the first gate electrode 131, the second activation layer 133 is located on the gate insulating layer 132, and the drain electrode 135 and the source electrode 134 are located on the second activation layer 133. The first gate electrode 131, the drain electrode 135, and the source electrode 134 may be formed of a transparent material including at least one of an ITO, an IZO, and an Ag nanowire.

The second activation layer 133 may include at least one of amorphous silicon, polycrystalline silicon, and a semiconductor oxide.

Further, the second electrode 126 of the display element 120 and the drain electrode 135 of the transistor 130 are electrically connected, and may be formed of the same material.

The second passivation layer 136 is located on the second activation layer 133, the source electrode 134, and the drain electrode 135, and the second gate electrode 137 is located on the second passivation layer 136. The second gate electrode 137 may be formed of a transparent material including at least one of an ITO, an IZO, and an Ag nanowire.

A third passivation layer 102 is formed on the transistor 130 configured as described above, to protect the transistor 130.

The bonding electrode 113a and the bonding electrode 112a are located on the third passivation layer 102. The bonding electrode 113a is connected to the first electrode 125 through the contact hole, and the bonding electrode 112a is connected to the source electrode 134 of the transistor 130 through the contact hole. The bonding electrodes 112a and 113a may be formed of a transparent material including at least one of an ITO or an IZO and an Ag nanowire.

The substrate 200 includes a first substrate layer 201, the data line 211 and the power voltage line 212 located on the first substrate layer 201, a second substrate layer 202 located on the data line 211 and the power voltage line 212, the gate line (not illustrated) and the power voltage line 213 located on the second substrate layer 202, a third substrate layer 203 located on the gate line (not illustrated) and the power voltage line 213, and pads 212c and 213c located on the third substrate layer 203 and connected to the corresponding signal line through the contact hole.

Next, a method of manufacturing the display module 100 will be described with reference to FIGS. 5 to 7.

Figure 5:
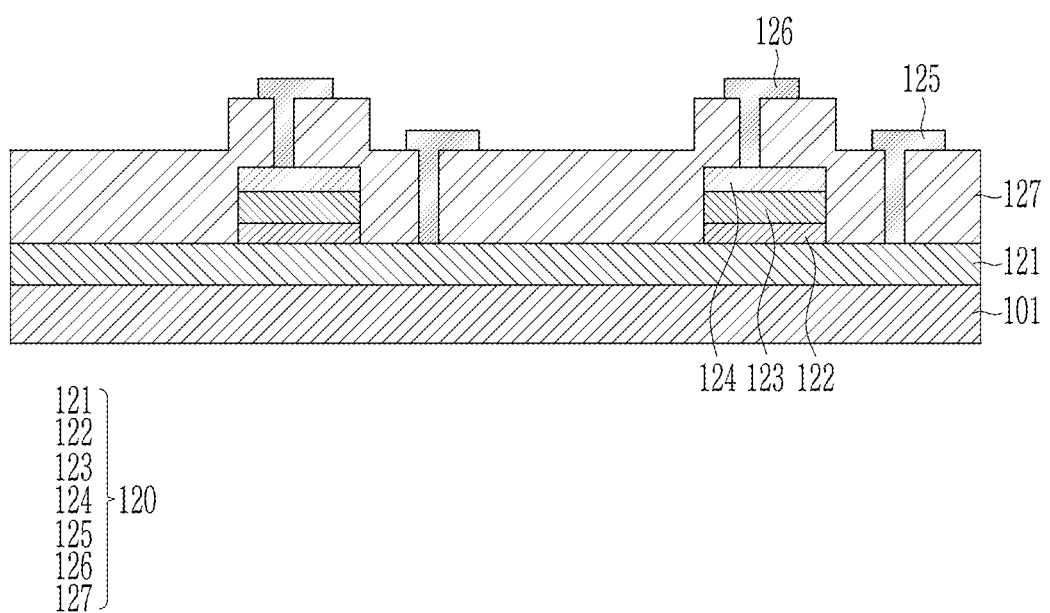
FIGS. 5 to 7 are cross-sectional views of the display module manufactured according to a method of manufacturing a display device according to an exemplary embodiment.
Figure 6:
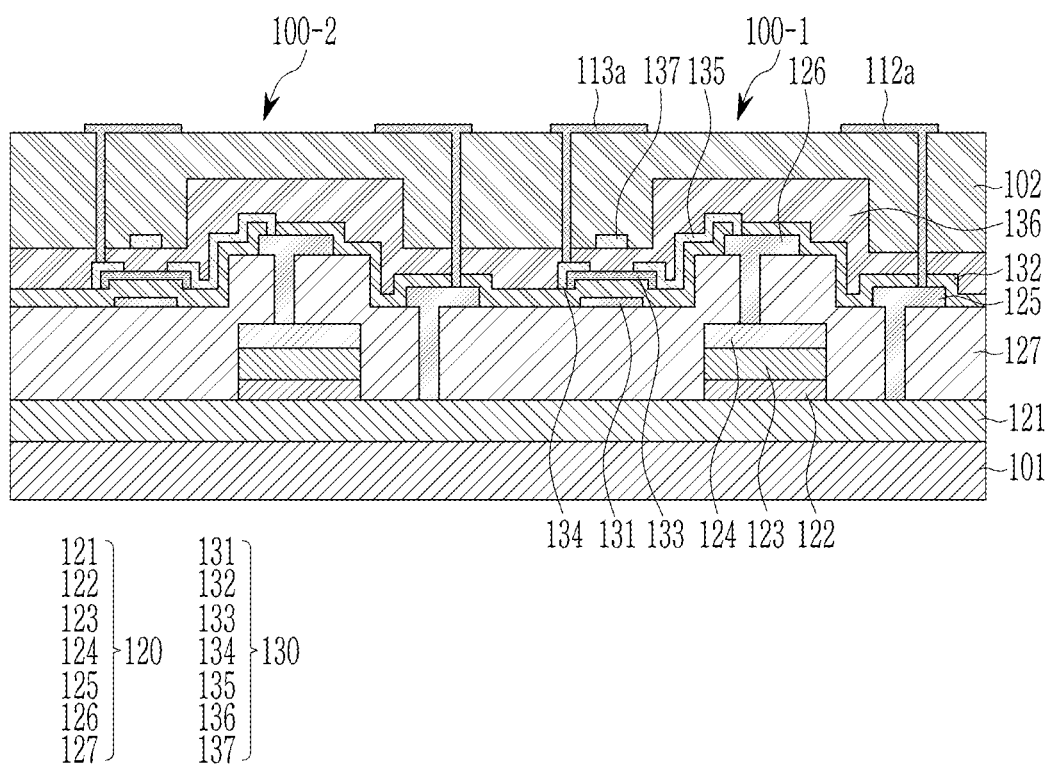
Figure 7:
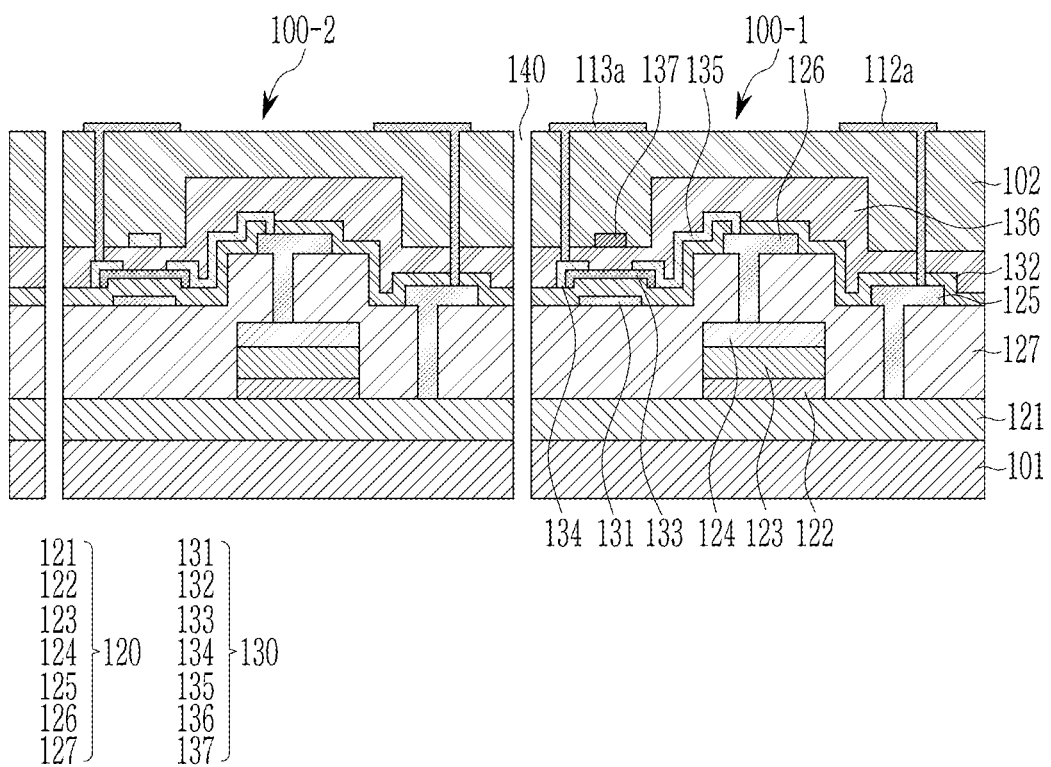

FIGS. 5 to 7 are cross-sectional views of the display module manufactured according to a method of manufacturing a display device according to an exemplary embodiment.

As illustrated in FIG. 5, a first conductive semiconductor layer 121, a first activation layer 122, a second conductive semiconductor layer 123, and a reflective layer 124 are formed on a module substrate 101.

Thereafter, a first passivation layer 127 is formed on the first conductive semiconductor layer 121, the first activation layer 122, the second conductive semiconductor layer 123, and the reflective layer 124. Then, an individual display element is formed by etching the layers 121, 122, 123, and 124 formed on the module substrate 101.

Then, a first electrode 125 and a second electrode 126 are formed on the first passivation layer 127. The first electrode 125 is connected to the first conductive semiconductor layer 121 through a contact hole. The second electrode 126 is connected to the reflective layer 124 through the contact hole.

Next, as illustrated in FIG. 6, a transistor 130 is formed on a display element 120.

A first gate electrode 131 is formed on the first passivation layer 127. The first gate electrode 131 may be formed together with the first electrode 125 and the second electrode 126. A gate insulating layer 132 is formed on the first gate electrode 131, the first electrode 125, and the second electrode 126.

A second activation layer 133 is formed on the gate insulating layer 132, and a drain electrode 135 and a source electrode 134 are formed in a drain region and a source region of the second activation layer 133, respectively. The drain electrode 135 of the transistor 130 is connected with the second electrode 126 of the display element 120 through the contact hole.

A second passivation layer 136 is formed on the second activation layer 133, the source electrode 134, and the drain electrode 135. A second gate electrode 137 is formed on the second passivation layer 136.

A third passivation layer 102 is formed on the second passivation layer 136 and the second gate electrode 137. The first to third passivation layers 127, 136, and 102 may be formed of a single layer or multiple layers of a silicon oxide (SiOx) or a silicon nitride (SiNx), but are not limited thereto.

A bonding electrode 113a and a bonding electrode 112a are formed on the third passivation layer 120. The bonding electrode 113a is connected to the first electrode 125 through the contact hole, and the bonding electrode 112a is connected to the source electrode 134 of the transistor 130 through the contact hole.

Referring to FIG. 7, the transistor 130 is separated to display modules 100-1 and 100-2 having at least one display element 120 by cutting the display element 120 and the transistor 130 formed on the module substrate 101 along a cutting line 140.

Next, a display device in which various forms of display modules are disposed will be described with reference to FIGS. 8 to 10.

Figure 8:
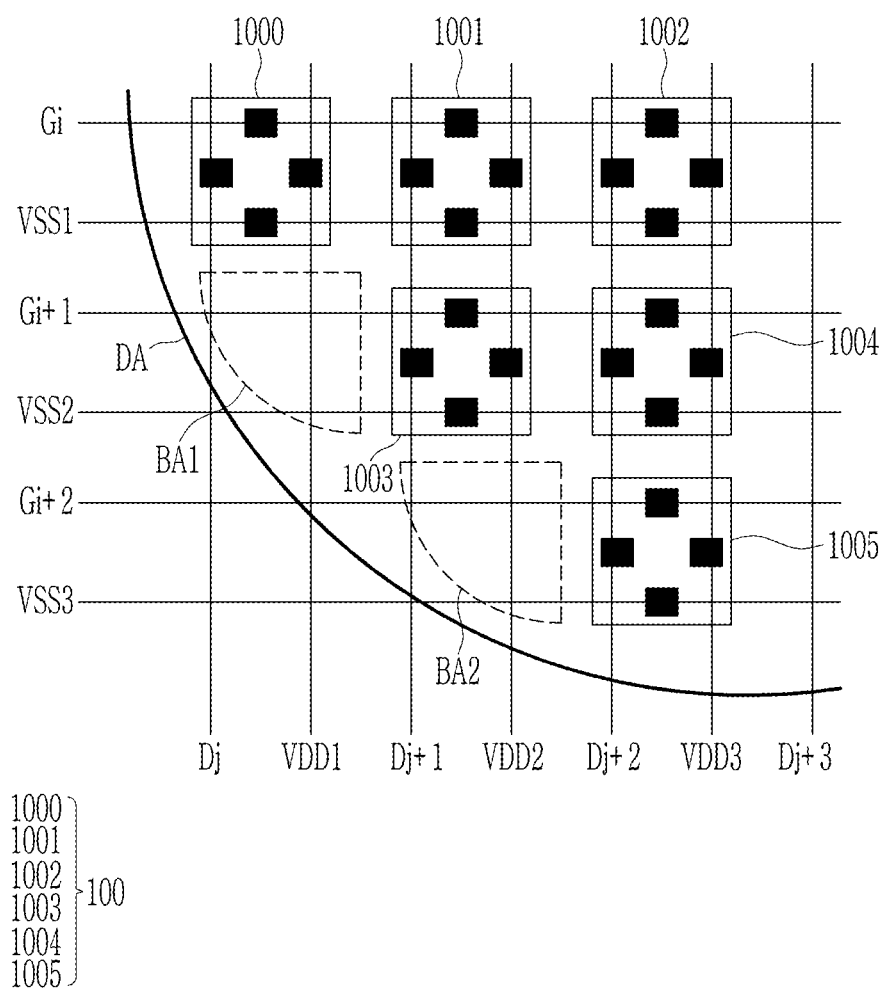
FIGS. 8 to 10 are top plan views illustrating the display device according to various aspects of the exemplary embodiment.
Figure 9:
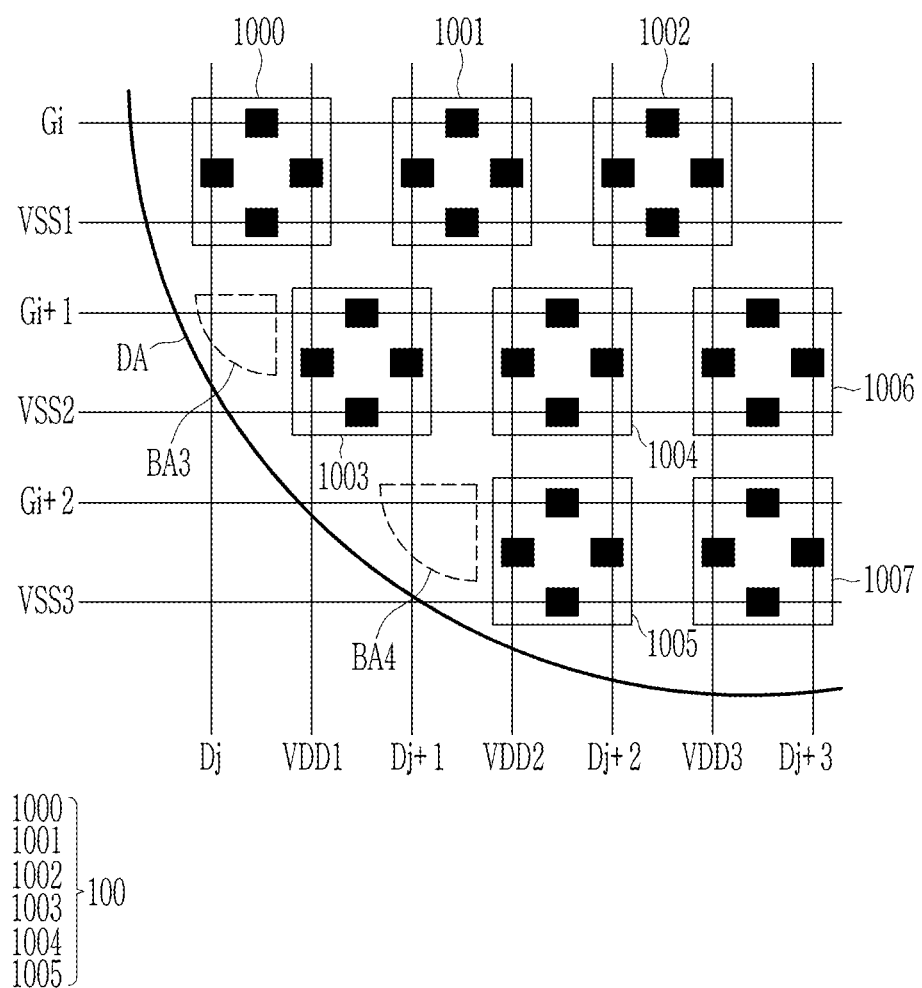
Figure 10:
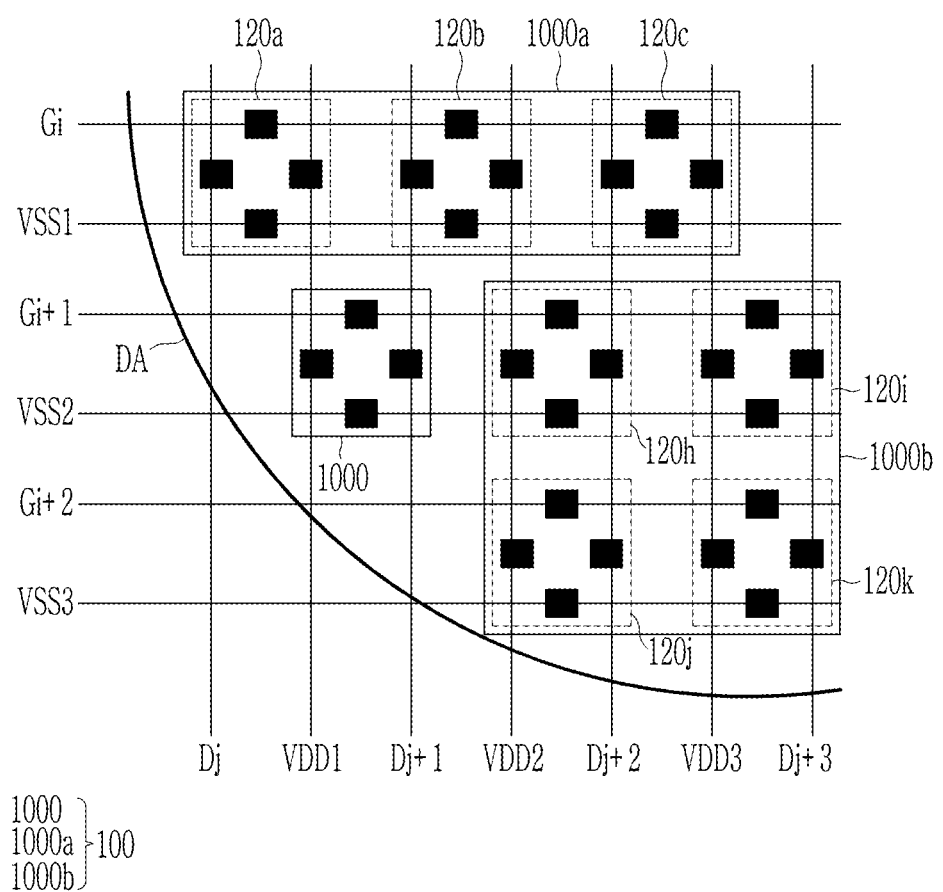

FIGS. 8 to 10 are top plan views illustrating the display device according to various aspects of the exemplary embodiment.

As illustrated in FIG. 8, a plurality of display modules 100 is located within a non-quadrangular display area DA. The display modules 100 are arranged in a matrix form. For example, the display modules 1000, 1001, and 1002 connected to the same gate line Gi are connected to the same power voltage line VSS1. Similarly, the display modules 1002, 1004, and 1005 connected to the same data line Dj+2 are connected to the same power voltage line VDD3.

As illustrated in FIG. 9, a plurality of display modules 100 is located within a non-quadrangular display area DA. The display modules 100 are arranged to be shifted in a column direction. For example, the display modules 1002, 1004, and 1005 connected to the same data line Dj+2 are connected to the different power voltage line VDD2 or VDD3.

In addition to this, the display module 100 may also be arranged to be shifted in a row direction along the form of the display area DA. That is, the display module 100 may be freely attached to a pad located on the substrate 200.

Comparing the dispositions of the display modules 100 of FIGS. 8 and 9, areas of the regions BA1 and BA2 in which the display modules 100 are not disposed in FIG. 8 are larger than areas of the regions BA3 and BA4 in which the display modules 100 are not disposed in FIG. 9. Therefore, a bezel area in the non-quadrangular display area DA is viewed more widely.

The display device according to the exemplary embodiment may provide a bezelless display device by freely disposing the display modules 100.

Referring to FIG. 10, the display modules 1000a and 1000b may include a plurality of display elements 120a, . . . , and 120k. For example, the display module 1000a may have display elements 120a, 120b, and 120c arranged in series. The display module 1000b may have display elements 120h, 120i, 120j, and 120k arranged in a 2×2 form.

The display module 100 may be configured in various forms while including various number of display elements, so that the display module 100 may correspond to various forms and/or various sizes of the display area DA.

In the meantime, in FIG. 10, it is described that one display module 1000a or 1000b includes the plurality of display elements 120a, . . . , and 120k, but various display modules may be coupled as one display module so that one module includes the plurality of display elements.

The display device according to the exemplary embodiment uses an individual display module chip, so that it is possible to implement a large display with a size of several tens of meters, which cannot be currently implemented in display devices using OLED display elements.

Figure 11:
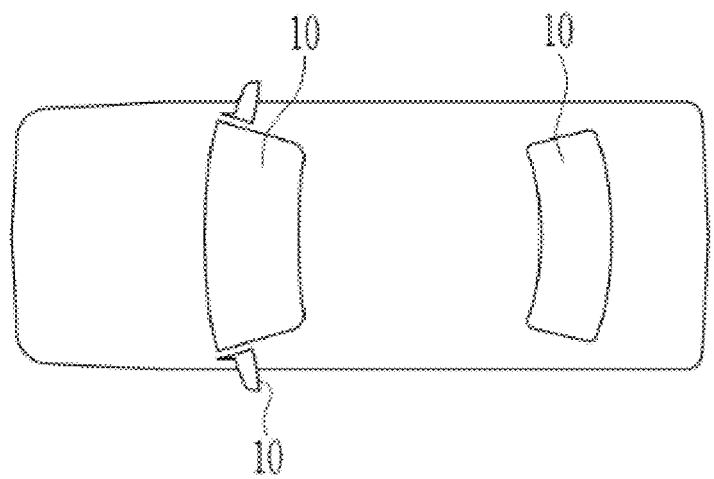
FIG. 11 is a schematic diagram illustrating an example in which a display device according to an embodiment is applied to the front and rear glasses of a vehicle.

Further, it was possible to implement a flexible display device using a subminature LED only in a passive matrix display form, but when the display module chip according to the present disclosure is used, it is possible to implement a flexible active matrix display using a subminiature LED. By disposing the gate driving unit 300 and the source driving unit 400 for driving the display device 10 in the bezel around the display area DA, the display device 10 according to the exemplary embodiment may also be used in a front glass, a rear glass, and side mirrors of a vehicle as shown in FIG. 11, a glass of a building, a mirror, and the like.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device, comprising:
a substrate including a plurality of first pads transmitting a gate signal, a plurality of second pads transmitting a data signal, a plurality of third pads transmitting a first power voltage, and a plurality of fourth pads transmitting a second power voltage different from the first power voltage, within a display area; and
a plurality of display modules, each of which includes first to fourth bonding electrodes directly attached to the first to fourth pads, a first transistor directly connected to the first bonding electrode and the second bonding electrode, a second transistor directly connected to the third bonding electrode, and a light emitting diode directly connected to the second transistor and the fourth bonding electrode.

2. The display device of claim 1, wherein:
the substrate further includes a plurality of gate lines and a plurality of second power voltage lines extended in a first direction and arranged in a second direction crossing the first direction, and a plurality of data lines and a plurality of first power voltage lines extended in the second direction and arranged in the first direction, and
the plurality of first pads is connected to the plurality of gate lines, the plurality of second pads is connected to the plurality of data lines, the plurality of third pads is connected to the plurality of first power voltage lines, and the plurality of fourth pads is connected to the plurality of second power voltage lines.

3. The display device of claim 2, wherein:
the plurality of display modules is arranged in a matrix form in the first direction and the second direction, and
at least one of the plurality of display modules is arranged to be shifted in a column direction or a row direction.

4. The display device of claim 3, wherein:
at least one of the plurality of display modules connected to the first data line among the plurality of data lines is connected to a first power voltage line different from first power voltage lines of other display modules.

5. The display device of claim 3, wherein:
at least one of the plurality of display modules connected to a first gate line among the plurality of gate lines is connected to a second power voltage line different from second power voltage lines of other display modules.

6. The display device of claim 2, wherein:
the plurality of display modules includes a plurality of first display modules each of which includes a plurality of light emitting diodes, and a plurality of second display modules each of which includes one light emitting diode.

7. The display device of claim 6, wherein:
one of the plurality of first display modules includes a plurality of light emitting diodes arranged in a first configuration, and another of the plurality of first display modules includes a plurality of light emitting diodes arranged in a second configuration different from the first configuration.

8. The display device of claim 2, wherein:
the plurality of gate lines and the plurality of second power voltage lines, and the plurality of data lines and the plurality of first power voltage lines are located on different layers.

9. The display device of claim 1, wherein:
the display area has a non-quadrangular form.

10. The display device of claim 1, wherein:
the substrate has a curved form.

11. The display device of claim 10, wherein:
the substrate includes at least one of a front glass of a vehicle, a rear glass of a vehicle, or a side mirrors of a vehicle.

12. The display device of claim 1, further comprising:
a curved glass substrate,
wherein the substrate is flexible, and
the substrate is attached to the glass substrate.

13. The display device of claim 12, wherein:
the substrate includes at least one of a front glass of a vehicle, a rear glass of a vehicle, or a side mirrors of a vehicle.

14. The display device of claim 1, further comprising:
a gate driving unit supplying the gate signal and a source driving unit supplying the data signal, the gate driving unit and the source driving unit being disposed in a bezel area.

15. The display device of claim 1,
wherein each of the plurality of display modules further includes:
a display element including a substrate, a first conductive semiconductor layer on the substrate, a first electrode on the first conductive semiconductor layer, a first activation layer on the first conductive semiconductor layer, a second conductive semiconductor layer on the first activation layer, a reflective layer on the second conductive semiconductor layer, a first passivation layer covering the reflective layer, a first electrode connected to the first conductive semiconductor layer and located on the first passivation layer, and a second electrode connected to the reflective layer and located on the passivation layer, in which the light emitting diode includes the first conductive semiconductor layer, the first activation layer, and the second conductive semiconductor layer; and
a transistor including a first gate electrode on the first passivation layer, a gate insulating layer on the first gate electrode, a second activation layer on the gate insulating layer, a source electrode and a drain electrode on the second activation layer, a second passivation layer covering the source electrode and the drain electrode, and a second gate electrode on the second passivation layer, and
wherein the first bonding electrode is connected to the first electrode, the second bonding electrode is connected to the drain electrode, and the second electrode is connected to the source electrode.

* * * * *